United States Patent
Kuo et al.

(10) Patent No.: US 8,963,675 B2
(45) Date of Patent: Feb. 24, 2015

(54) METHOD FOR FABRICATING A CARRIER WITH A THREE DIMENSIONAL INDUCTOR AND STRUCTURE THEREOF

(71) Applicant: Chipbond Technology Corporation, Hsinchu (TW)

(72) Inventors: Chih-Ming Kuo, Hsinchu County (TW); You-Ming Hsu, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 327 days.

(21) Appl. No.: 13/644,964

(22) Filed: Oct. 4, 2012

(65) Prior Publication Data
US 2013/0027172 A1    Jan. 31, 2013

Related U.S. Application Data

(62) Division of application No. 13/173,022, filed on Jun. 30, 2011, now Pat. No. 8,347,490.

(51) Int. Cl.
| | |
|---|---|
| *H01F 5/00* | (2006.01) |
| *H01F 27/28* | (2006.01) |
| *H05K 1/16* | (2006.01) |
| *H05K 3/46* | (2006.01) |

(52) U.S. Cl.
CPC ............... *H01F 5/00* (2013.01); *H05K 1/165* (2013.01); *H05K 3/465* (2013.01); *H05K 2201/097* (2013.01)
USPC ........................... 336/200; 336/223; 336/232

(58) Field of Classification Search
CPC ................................. H05K 3/465; H01F 5/00
USPC ........................................ 336/200, 223, 232
See application file for complete search history.

(56) References Cited

U.S. PATENT DOCUMENTS

| | | | |
|---|---|---|---|
| 5,646,368 A | * | 7/1997 | Muyshondt et al. ............ 174/33 |
| 6,008,102 A | | 12/1999 | Alford et al. |
| 6,031,445 A | * | 2/2000 | Marty et al. ................... 336/200 |
| 6,037,649 A | * | 3/2000 | Liou ............................. 257/531 |

(Continued)

FOREIGN PATENT DOCUMENTS

CN    101116172 A    1/2008

OTHER PUBLICATIONS

Chinese Office Action mailed Jun. 25, 2014 for Chinese Patent Application No. 201110134743.4, 6 pages.

*Primary Examiner* — Elvin G Enad
*Assistant Examiner* — Ronald Hinson
(74) *Attorney, Agent, or Firm* — Jackson IPG PLLC

(57) ABSTRACT

A method for fabricating a carrier with a three-dimensional inductor comprises the steps of providing a substrate having a protective layer; forming a first photoresist layer on the protective layer; patterning the first photoresist layer to form a second opening and a plurality of disposing slots; forming a first metal layer in second opening and disposing slots; removing the first photoresist layer; forming a first dielectric layer on the protective layer; forming a second photoresist layer on the first dielectric layer; patterning the second photoresist layer to form a plurality of slots; forming a second metal layer in slots to form a plurality of inductive portions; removing the second photoresist layer; forming a second dielectric layer on the first dielectric layer; forming a third photoresist layer on the second dielectric layer; patterning the third photoresist layer to form a plurality of slots; and forming a third metal layer in slots.

2 Claims, 23 Drawing Sheets

(56) References Cited

U.S. PATENT DOCUMENTS

| | | | |
|---|---|---|---|
| 7,088,215 B1 * | 8/2006 | Winter et al. | 336/200 |
| 7,339,452 B2 * | 3/2008 | Lee | 336/200 |
| 7,397,107 B2 * | 7/2008 | Brennan et al. | 257/532 |
| 7,868,727 B2 * | 1/2011 | Chen et al. | 336/200 |
| 8,384,507 B2 * | 2/2013 | Li et al. | 336/200 |
| 2004/0124961 A1 * | 7/2004 | Aoyagi | 336/200 |
| 2005/0174208 A1 * | 8/2005 | Sato et al. | 336/200 |
| 2007/0090912 A1 | 4/2007 | Lee | |
| 2007/0236319 A1 | 10/2007 | Hsu et al. | |
| 2008/0252407 A1 * | 10/2008 | Anderson | 336/177 |
| 2008/0303623 A1 * | 12/2008 | Hsu et al. | 336/200 |

* cited by examiner

METHOD FOR FABRICATING A CARRIER WITH A THREE DIMENSIONAL INDUCTOR AND STRUCTURE THEREOF

FIELD OF THE INVENTION

The present invention is generally relating to a method for fabricating a carrier, more particularly to a method for fabricating a carrier with a three dimensional inductor.

BACKGROUND OF THE INVENTION

A conventional inductor, as we know, may utilize planar inductor as designs of inductor pattern and trace pattern in a same plane. For the reason that the inductor and trace are located in the same plane, a disturbance from parasitic capacitance is occurred and has to be overcome. In addition, the corresponding chip size can not be decreased, and the planar inductor merely forms a vortex structure instead of a toroid structure in a same radius.

SUMMARY

The primary object of the present invention is to provide a method for fabricating a carrier with a three dimensional inductor, the method comprises the steps as followed. Providing a substrate having a surface, at least one first bond pad and a protective layer, wherein the first bond pad is disposed on the surface, the protective layer is formed on the surface and comprises at least one first opening, a first disposing zone and a plurality of second disposing zones, the first bond pad is exposed by the first opening, and the first opening is located at the first disposing zone; forming a first photoresist layer on the protective layer; patterning the first photoresist layer to form a second opening and a plurality of first disposing slots, the first disposing zone is exposed by the second opening, the second disposing zones are exposed by the first disposing slots; forming a first metal layer within the second opening and the first disposing slots and enabling the first metal layer to form a first connecting pad and a plurality of first inductive portions, each of the first inductive portions comprises a first connecting terminal, a second connecting terminal and a first height; removing the first photoresist layer; forming a first dielectric layer on the protective layer and covering the first metal layer with the first dielectric layer, wherein the first dielectric layer comprises a third opening, a plurality of fourth openings and a plurality of fifth openings, the first connecting pad is exposed by the third opening, each of the first connecting terminals is exposed by each of the fourth openings, and each of the second connecting terminals is exposed by each of the fifth openings; forming a second photoresist layer on the first dielectric layer; patterning the second photoresist layer to form a second disposing slot, a plurality of third disposing slots and a plurality of fourth disposing slots, the first connecting pad is exposed by the second disposing slot, each of the first connecting terminals is exposed by each of the third disposing slots, and each of the second connecting terminals is exposed by each of the fourth disposing slots; forming a second metal layer within the second disposing slot, the third disposing slots and the fourth disposing slots and enabling the second metal layer to form a second inductive portion, a plurality of third inductive portions and a plurality of fourth inductive portions, wherein the second inductive portion is in connection with the first connecting pad and comprises a first top surface and a second height, each of the third inductive portions is in connection with each of the second connecting terminals and comprises a second top surface and a third height, each of the fourth inductive portions is in connection with each of the first connecting terminals and comprises a third top surface and a fourth height, wherein the dimension of the first height is smaller than that of the second height, the third height and the fourth height; removing the second photoresist layer; forming a second dielectric layer on the first dielectric layer and covering the second metal layer with the second dielectric layer, the second dielectric layer comprises a first exposing slot, a plurality of second exposing slots and a plurality of third exposing slots, the first top surface is exposed by the first exposing slot, each of the second top surfaces is exposed by each of the second exposing slots, and each of the third top surfaces is exposed by each of the third exposing slots; forming a third photoresist layer on the second dielectric layer; patterning the third photoresist layer to form a fifth disposing slot and a plurality of sixth disposing slots, the first top surface and the second top surface are exposed by the fifth disposing slot, each of the second top surfaces and each of the third top surfaces are exposed by each of the sixth disposing slots; and forming a third metal layer in the fifth disposing slot and the sixth disposing slots and enabling the third metal layer to form a fifth inductive portion and a plurality of sixth inductive portions, the fifth inductive portion is in connection with the second inductive portion and the third inductive portion, each of the sixth inductive portions is in connection with the third inductive portion and the fourth inductive portion, the fifth inductive portion comprises a fifth height, each of the sixth inductive portions comprises a sixth height, wherein the dimension of the fifth height and the sixth height are respectively smaller than that of the second height, the third height and the fourth height.

This invention utilizes the three dimensional inductor instead of a planar inductor so that a layout area in the same plane can be effectively reduced. Therefore, the corresponding chip size with the inductor disposed thereon can be decreased as well. Besides, because the inductor is a three dimensional design rather than a planar design, the magnetic flux direction of the inductor changes from normal to horizontal. It is beneficial for the electro-magnetic coupling of the flip chip module in the flip chip process.

DETAILED DESCRIPTION OF THE INVENTION

Figure 1A:
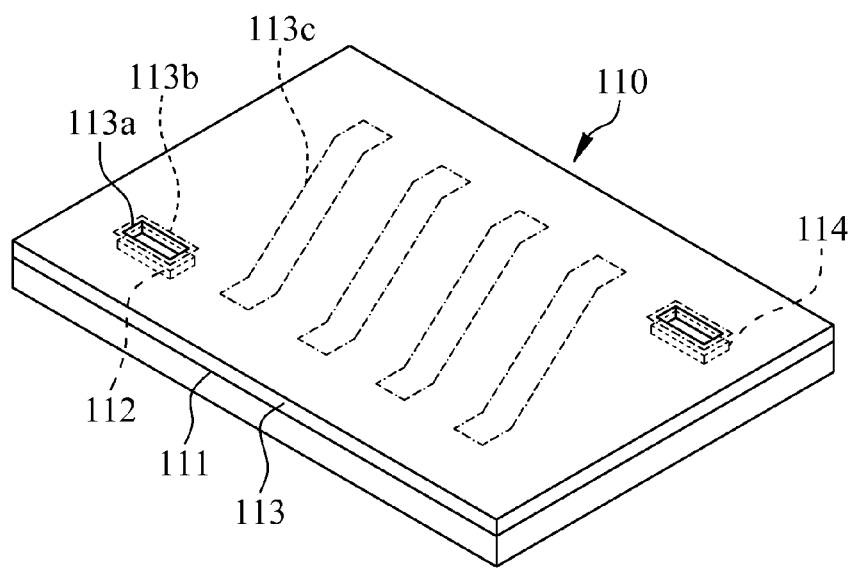
FIGS. 1A-1P are three dimensional views illustrating a method for fabricating a carrier with a three dimensional inductor in accordance with a preferred embodiment of the present invention.
Figure 1B:
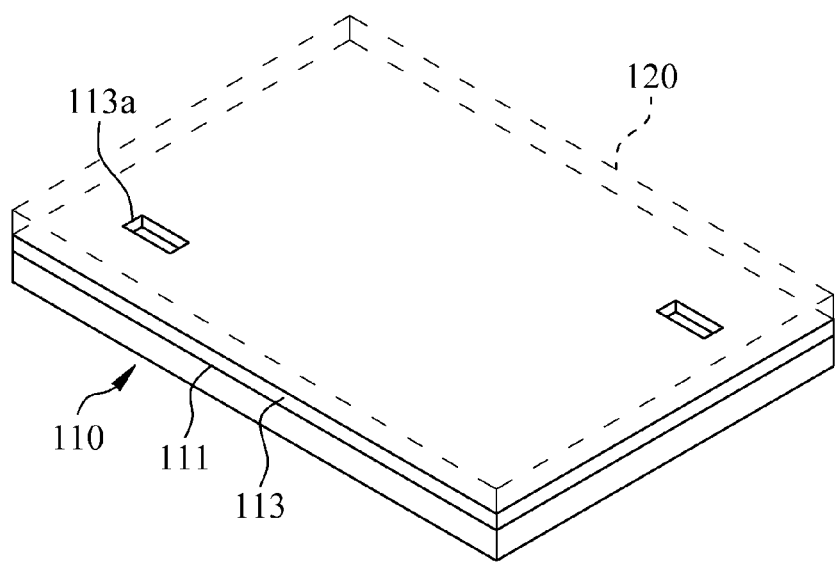
Figure 1C:
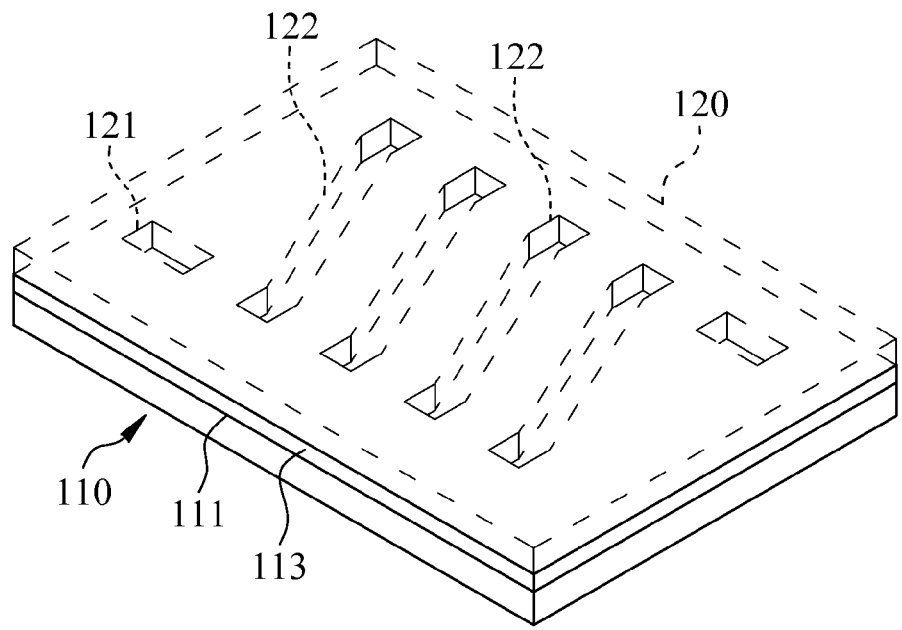
Figure 1D:
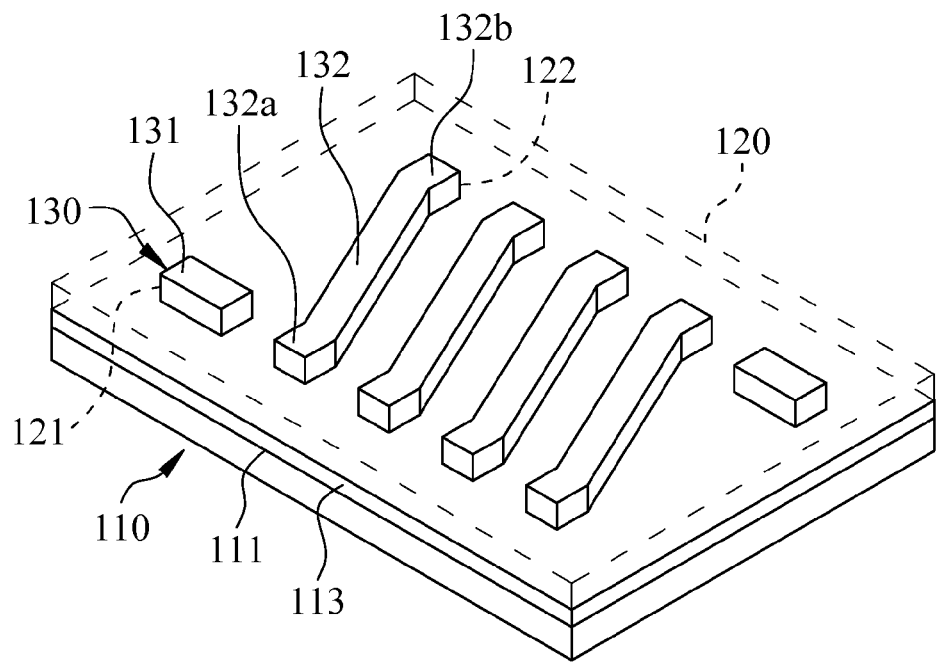
Figure 1E:
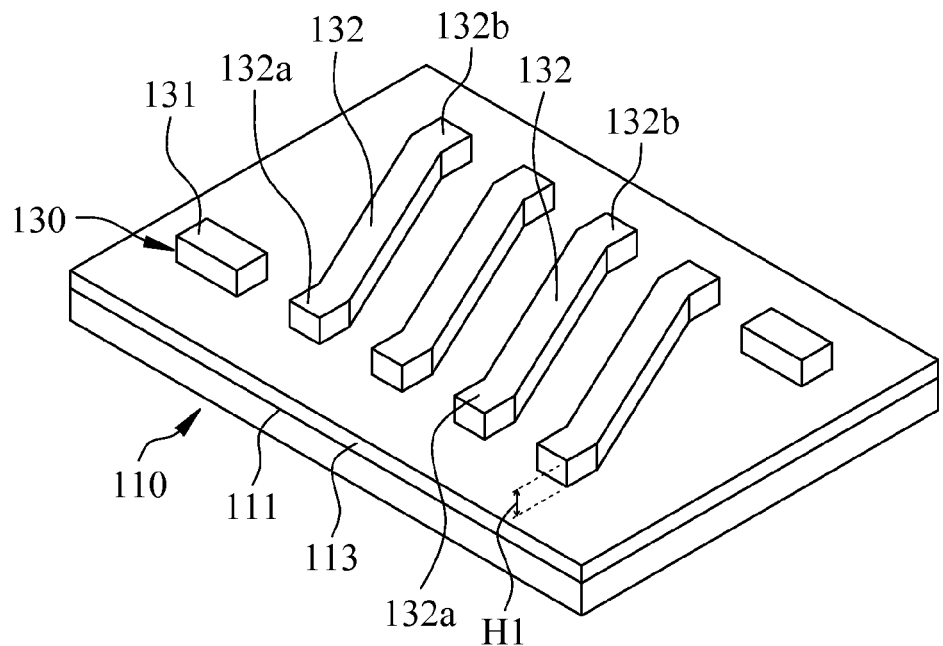
Figure 1F:
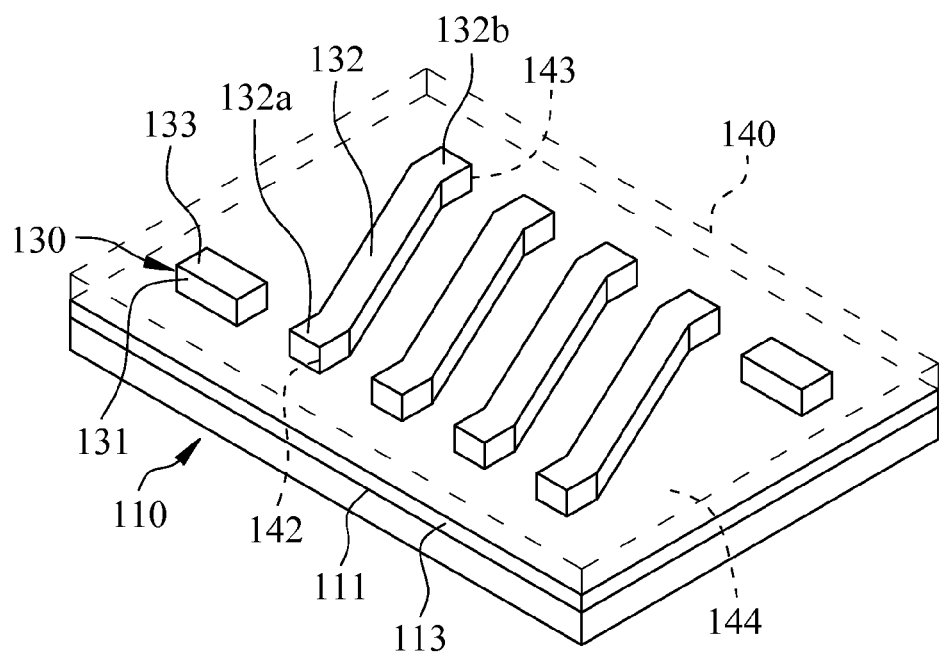
Figure 1G:
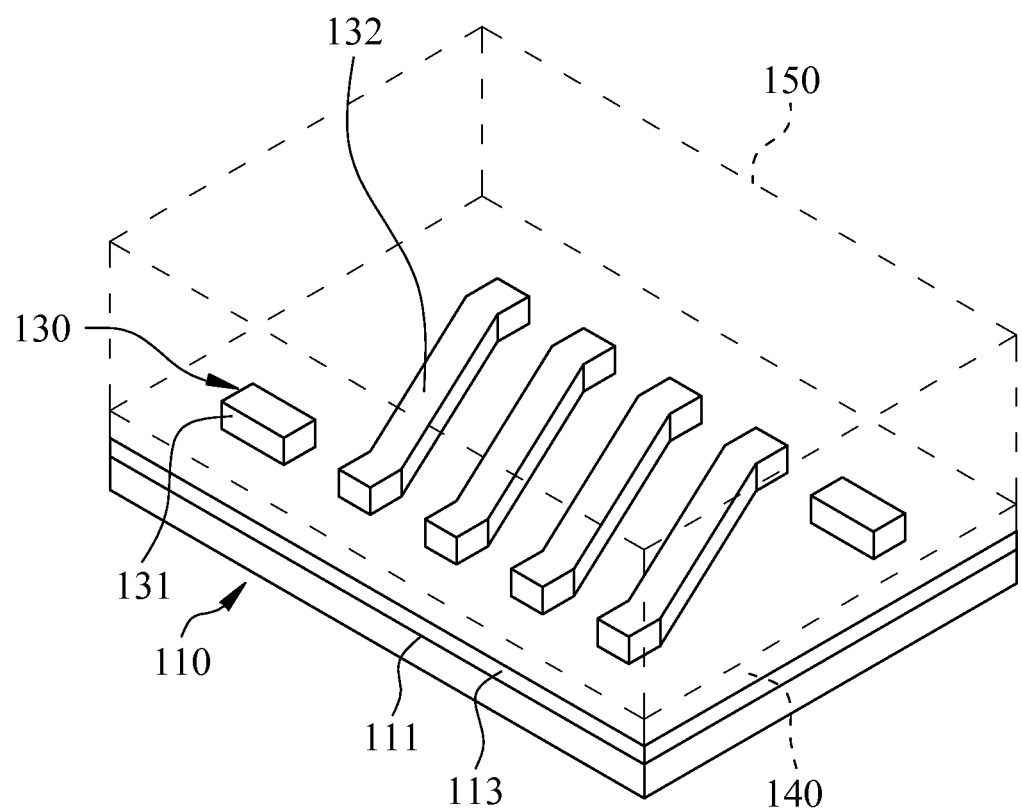
Figure 1H:
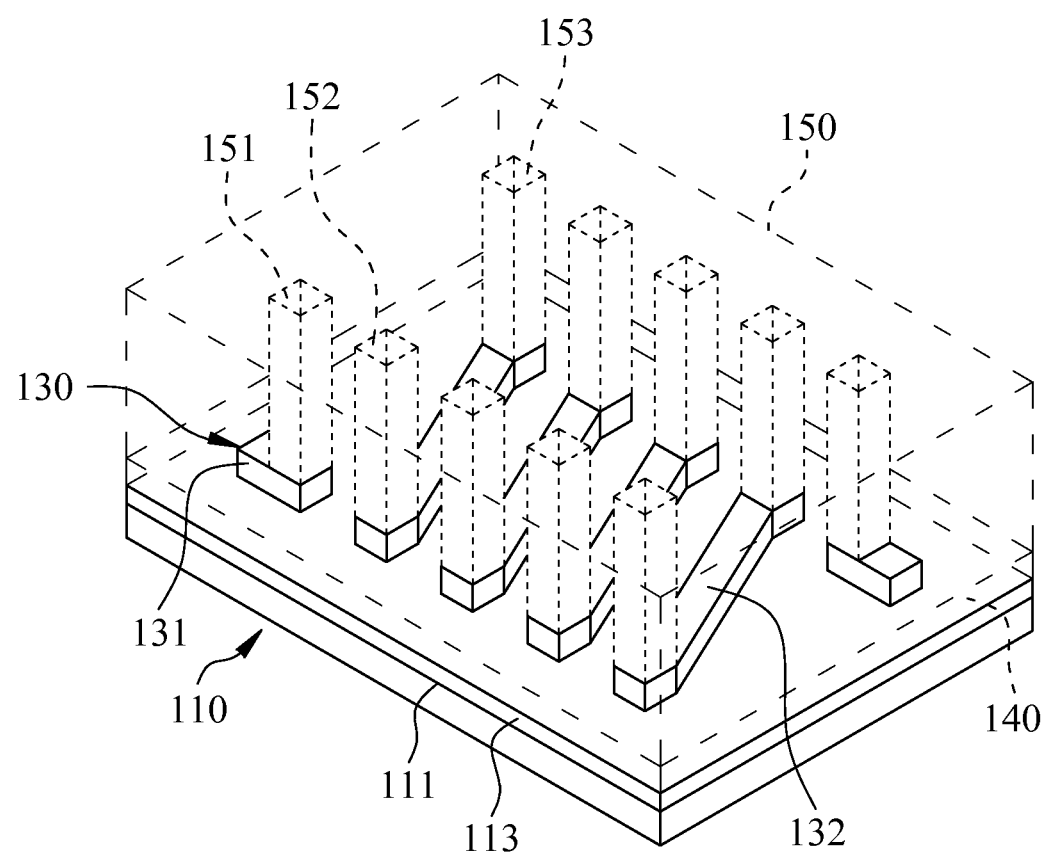
Figure 1I:
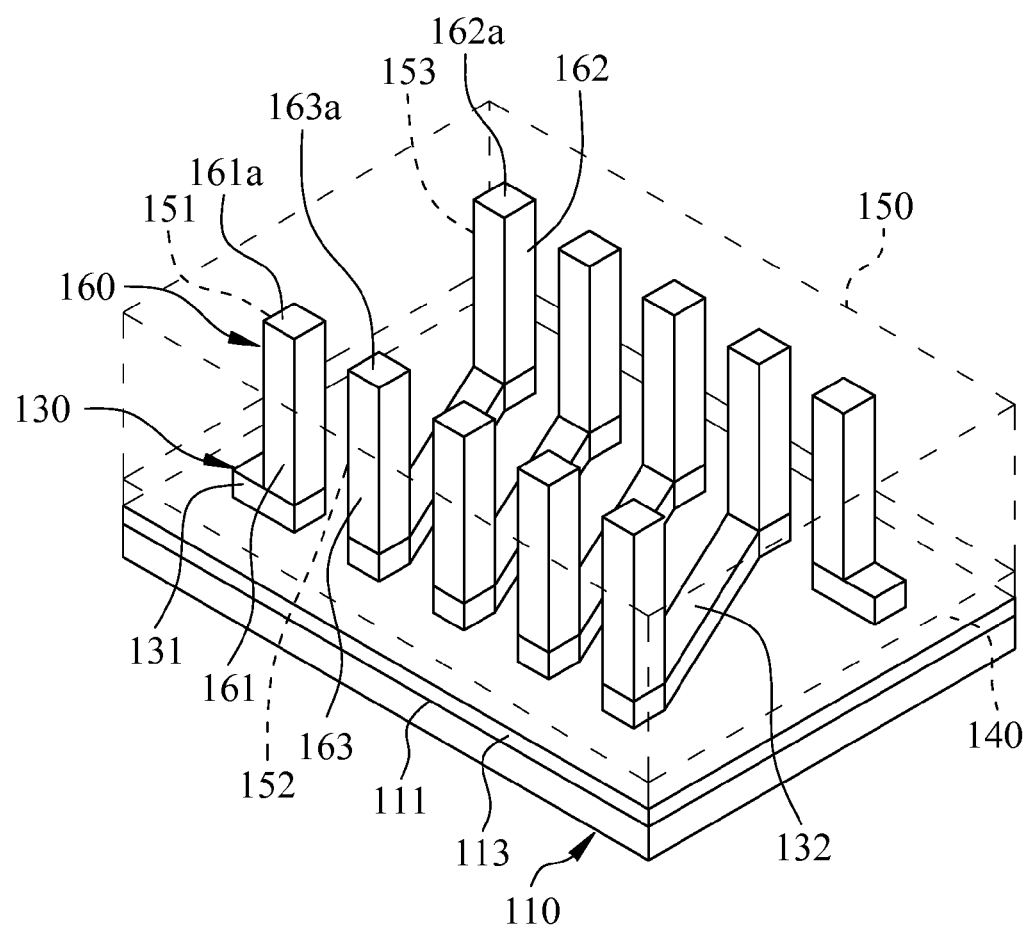
Figure 1J:
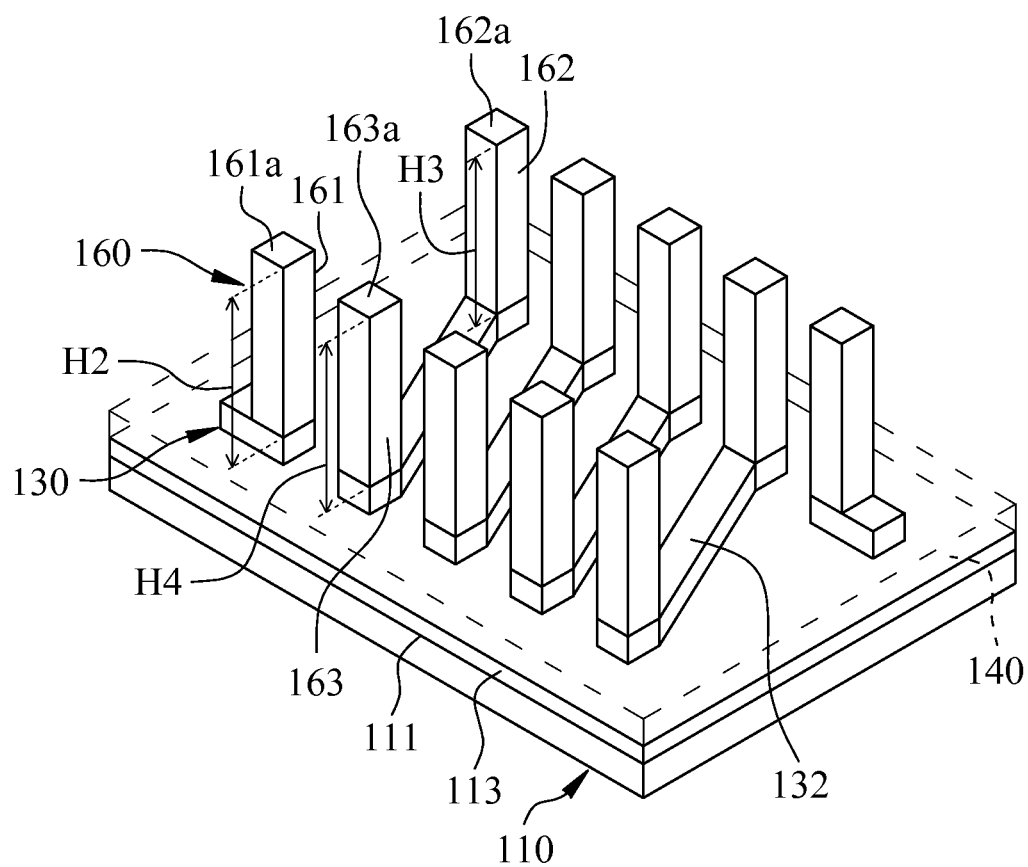
Figure 1K:
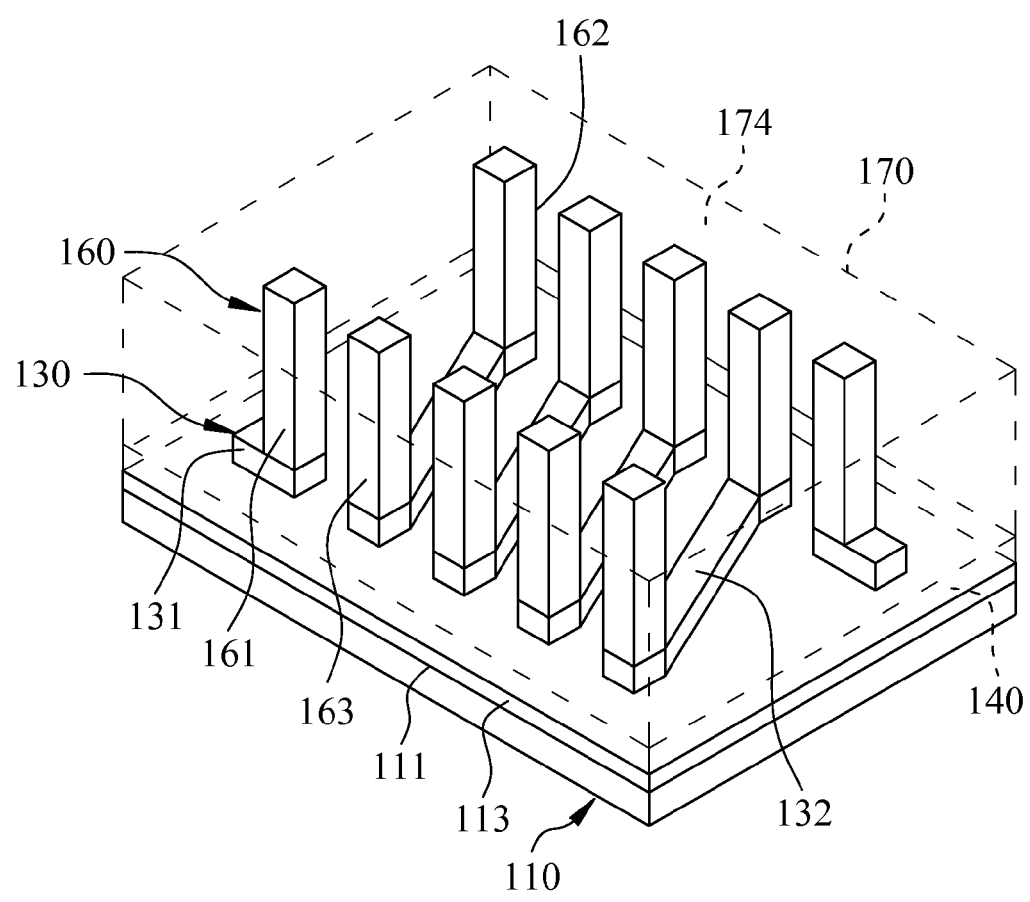
Figure 1L:
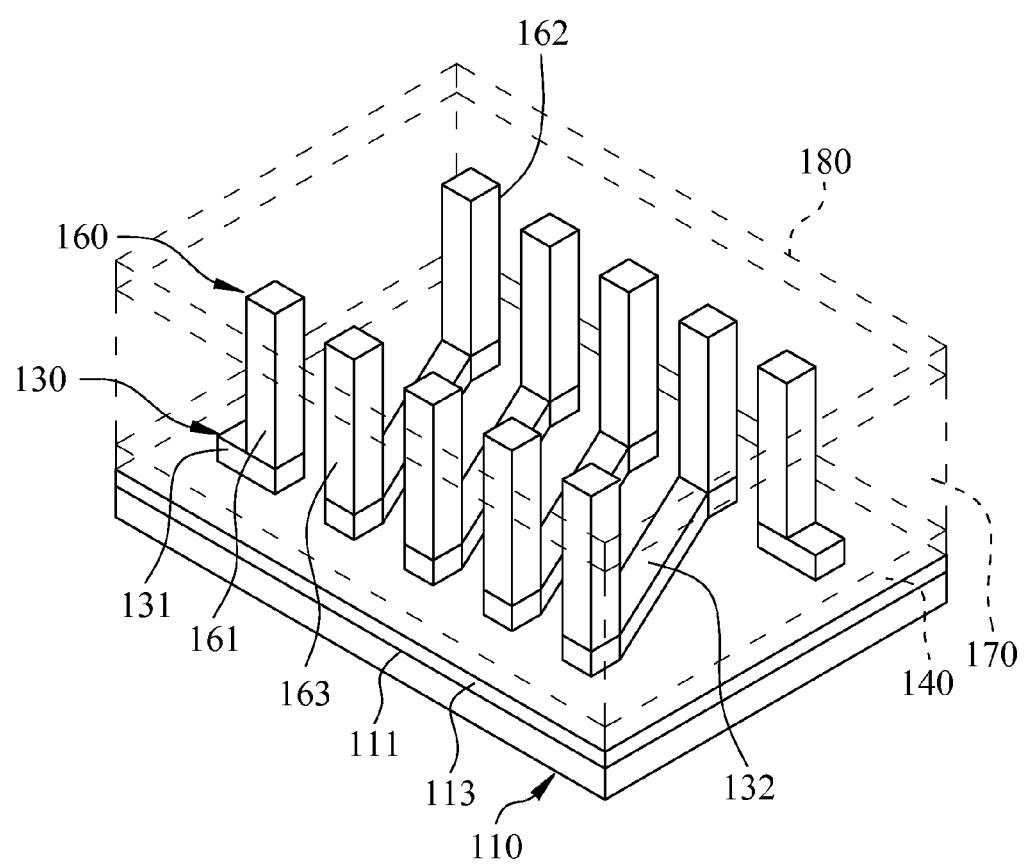
Figure 1M:
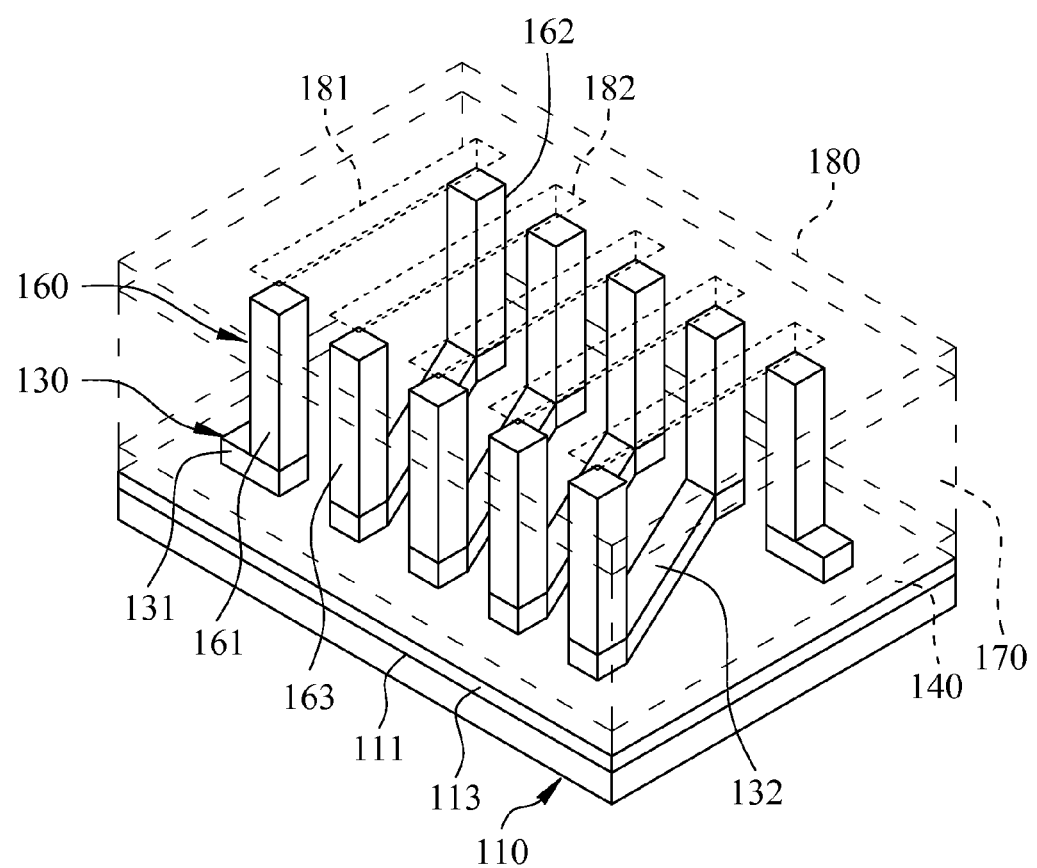
Figure 1N:
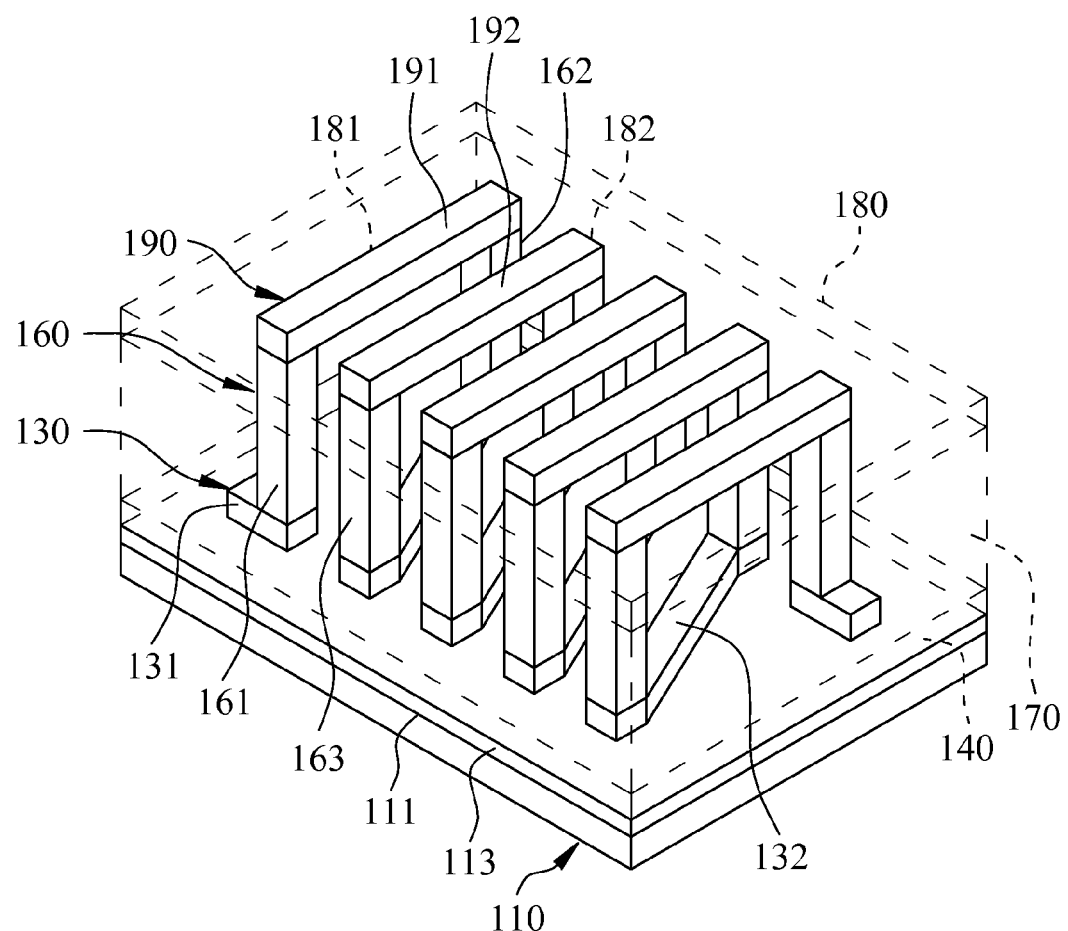
Figure 1O:
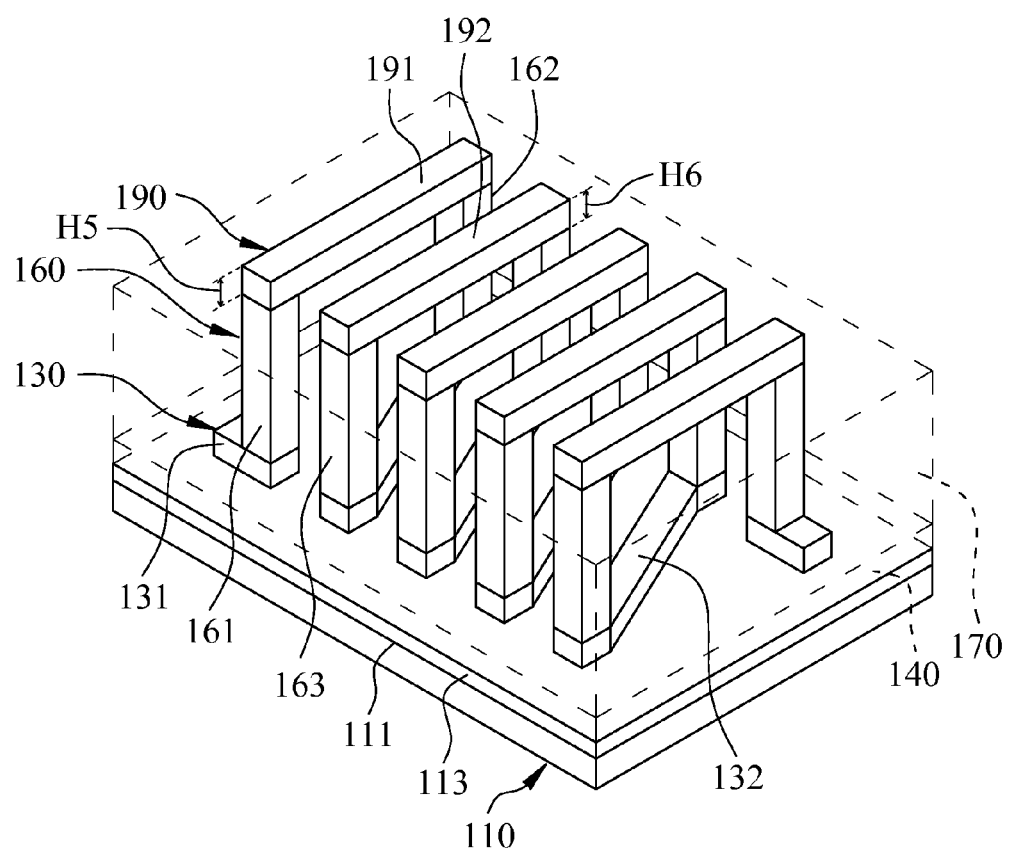
Figure 1P:
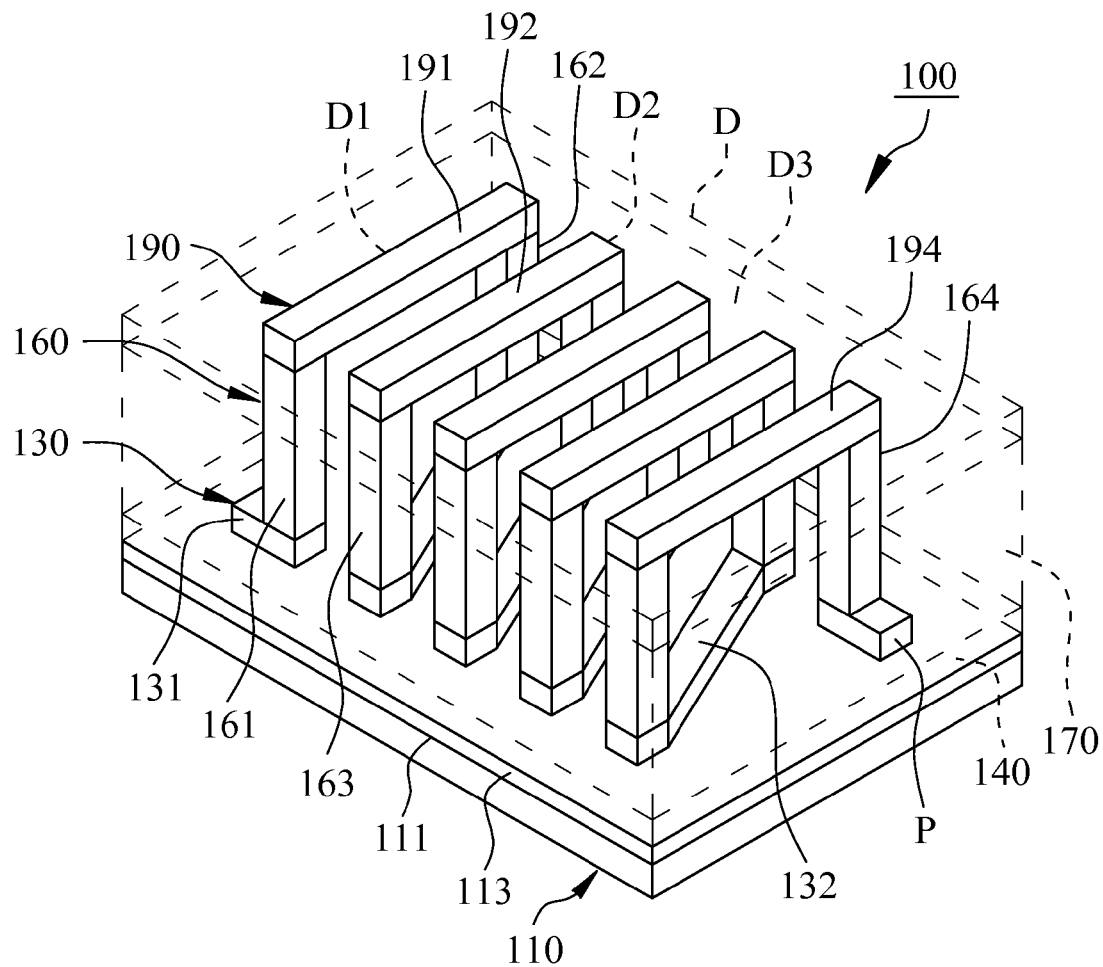
Figure 2A:
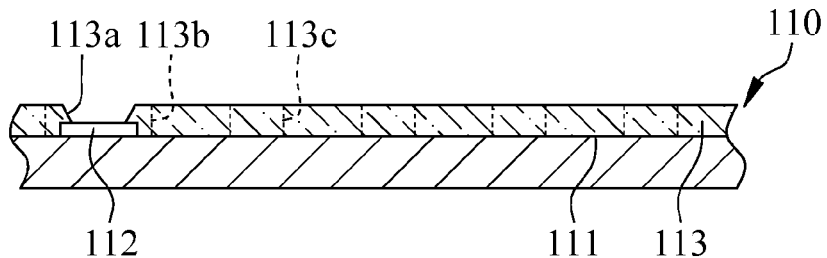
FIGS. 2A-2P are cross-section diagrams illustrating a method for fabricating a carrier with a three dimensional inductor in accordance with a preferred embodiment of the present invention.
Figure 2B:
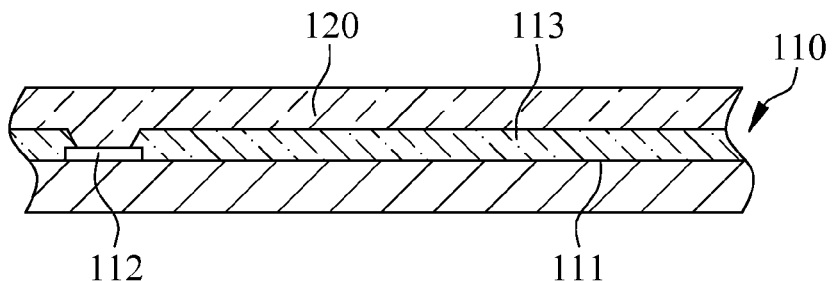
Figure 2C:
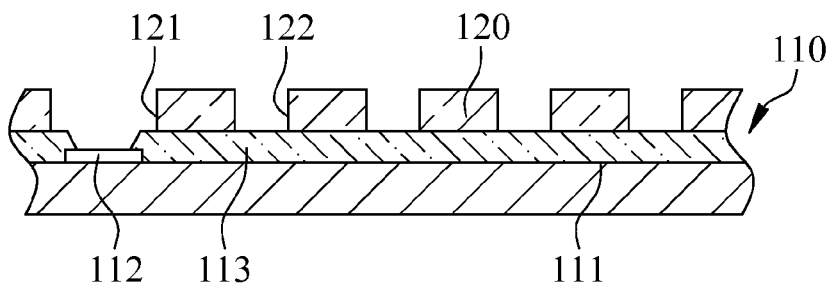
Figure 2D:
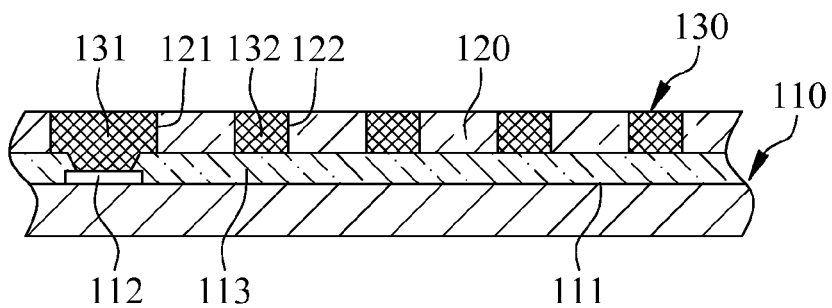
Figure 2E:
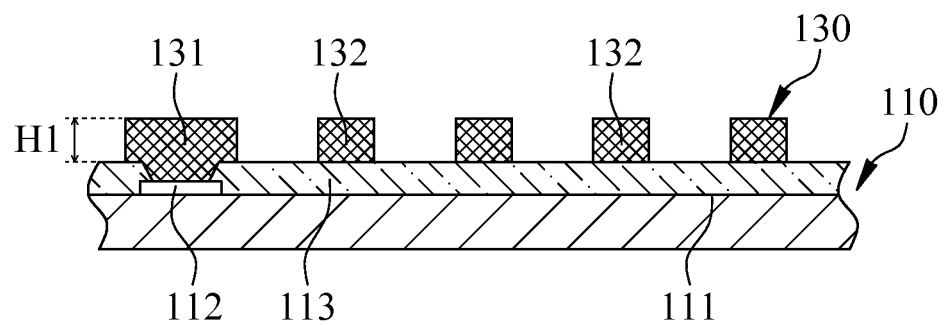
Figure 2F:
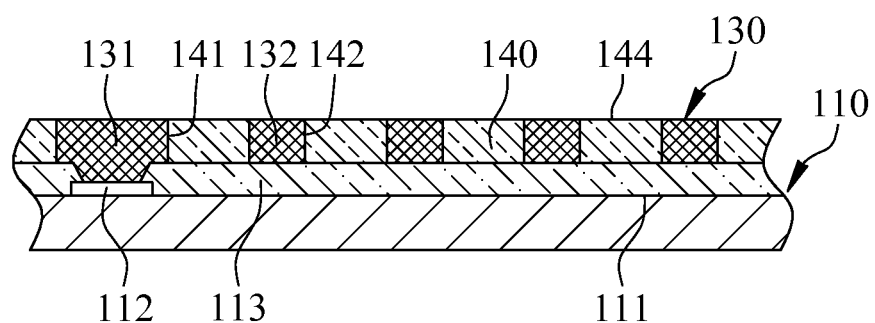
Figure 2G:
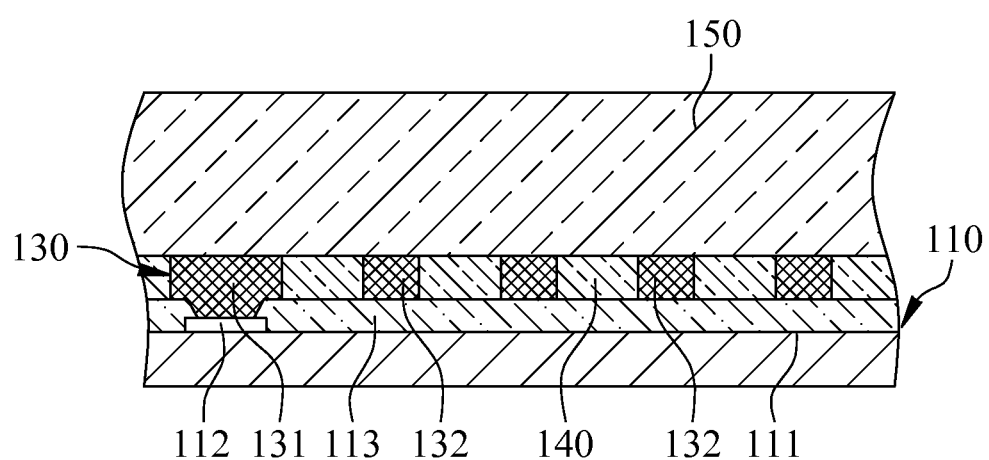
Figure 2H:
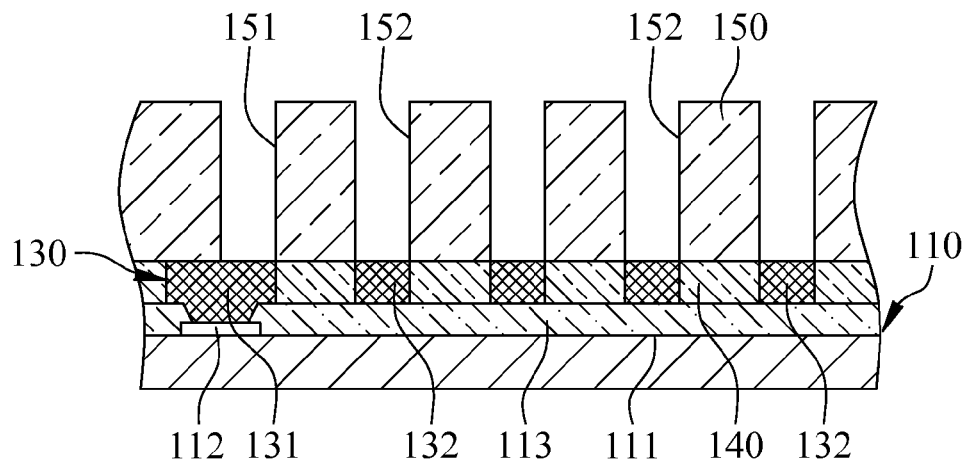
Figure 2I:
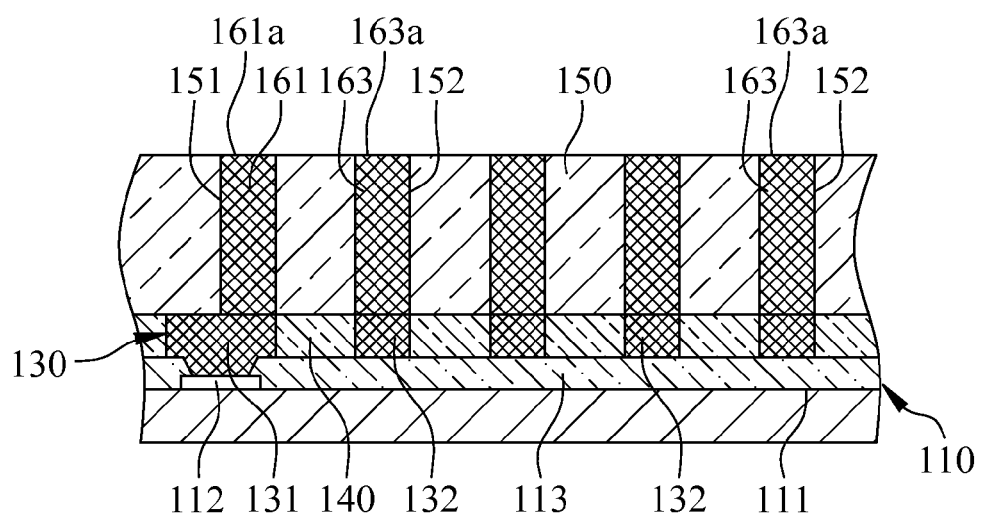
Figure 2J:
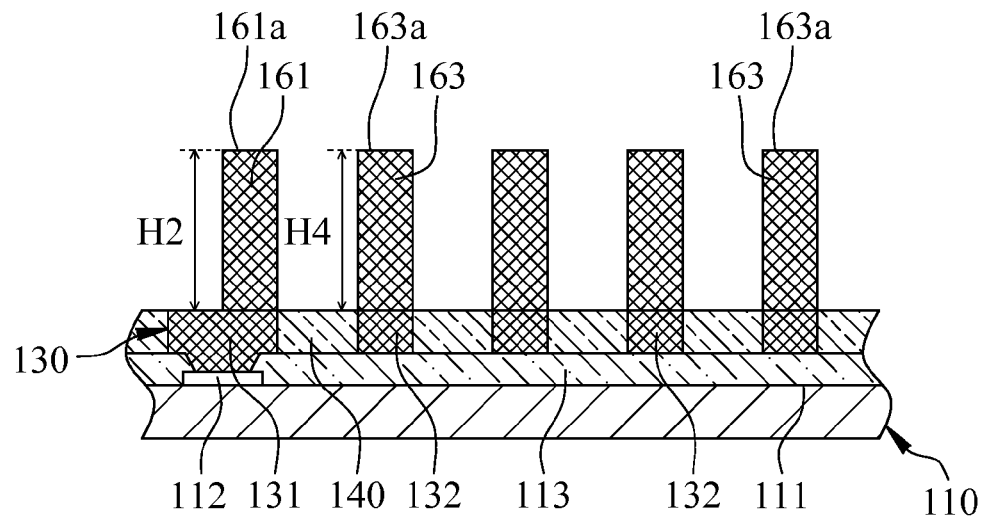
Figure 2K:
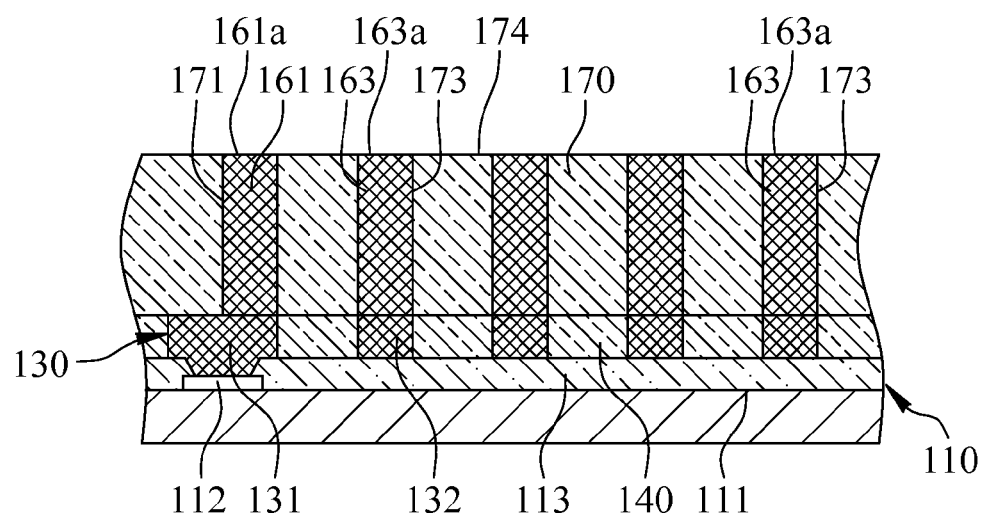
Figure 2L:
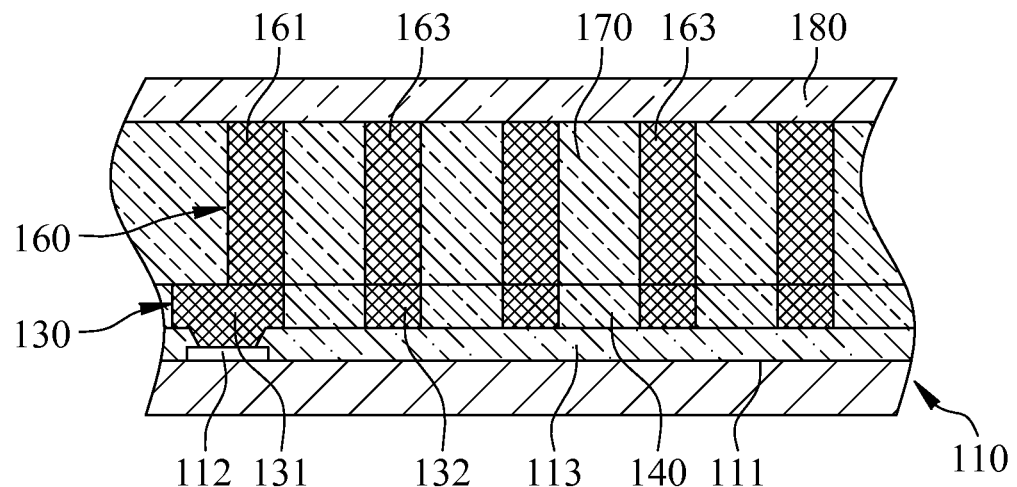
Figure 2M:
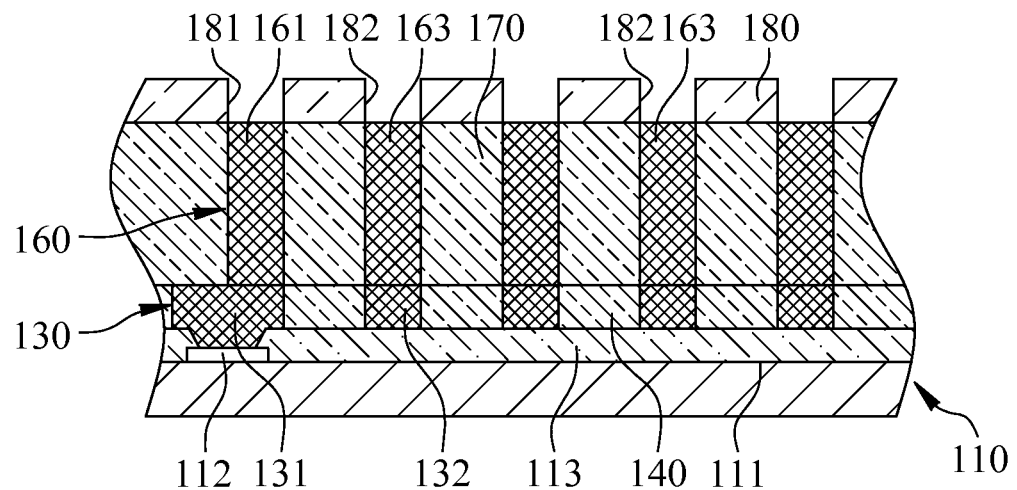
Figure 2N:
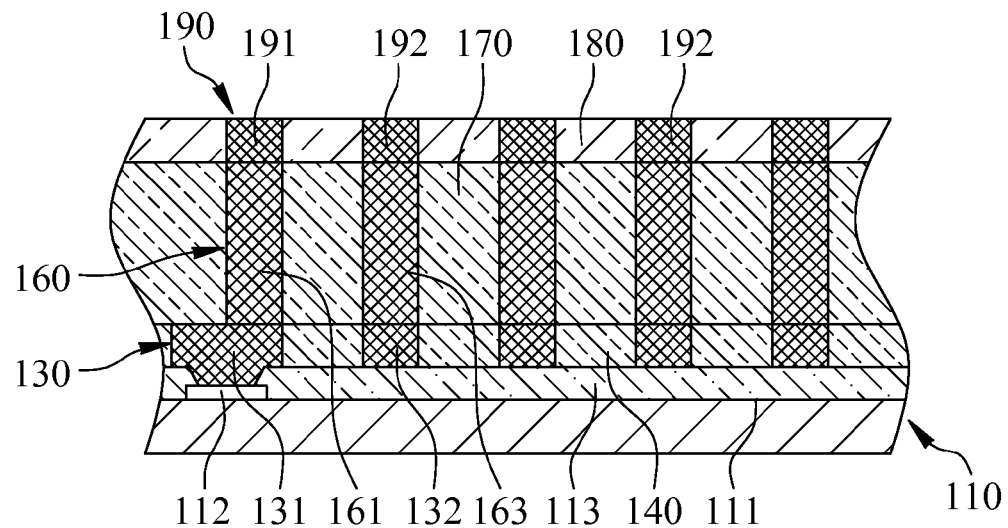
Figure 2O:
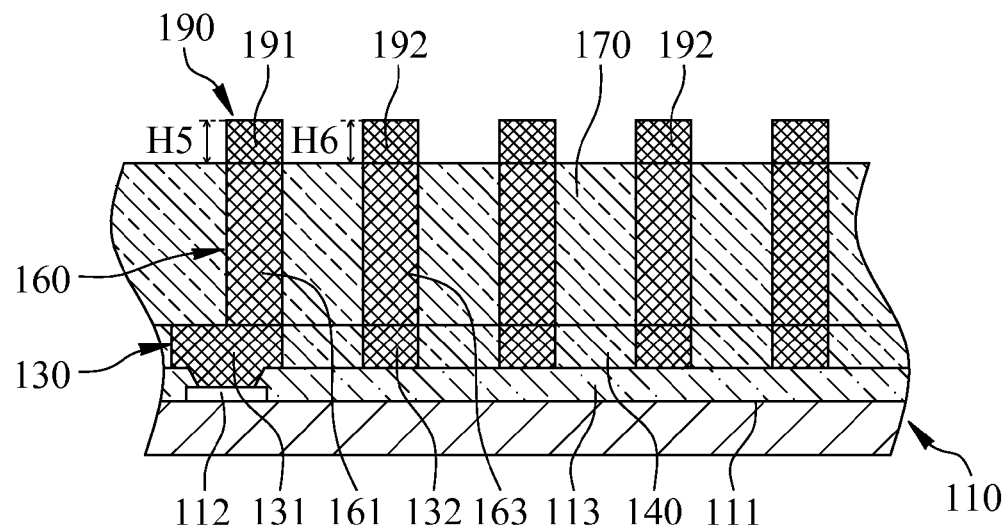
Figure 2P:
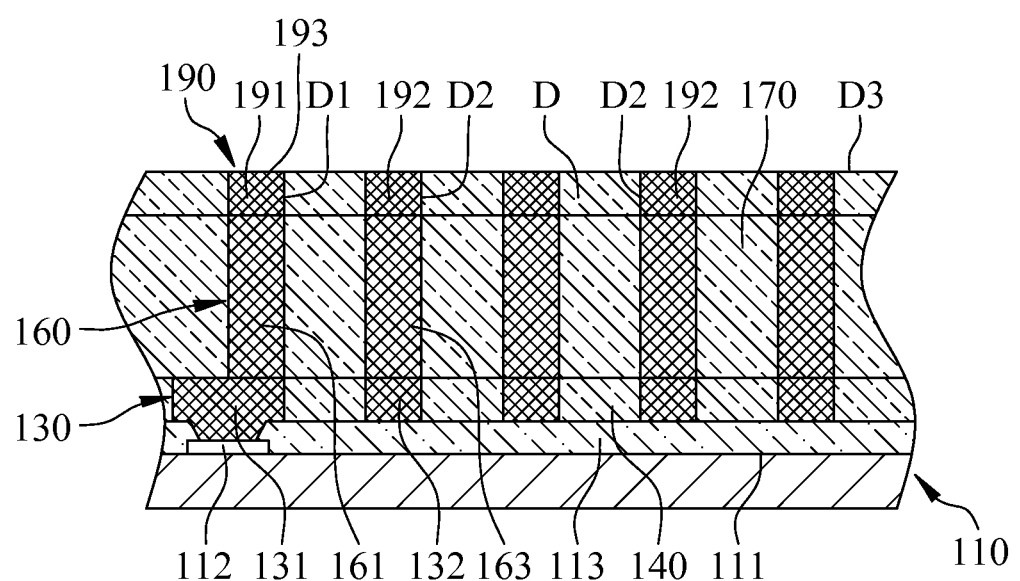
Figure 3:
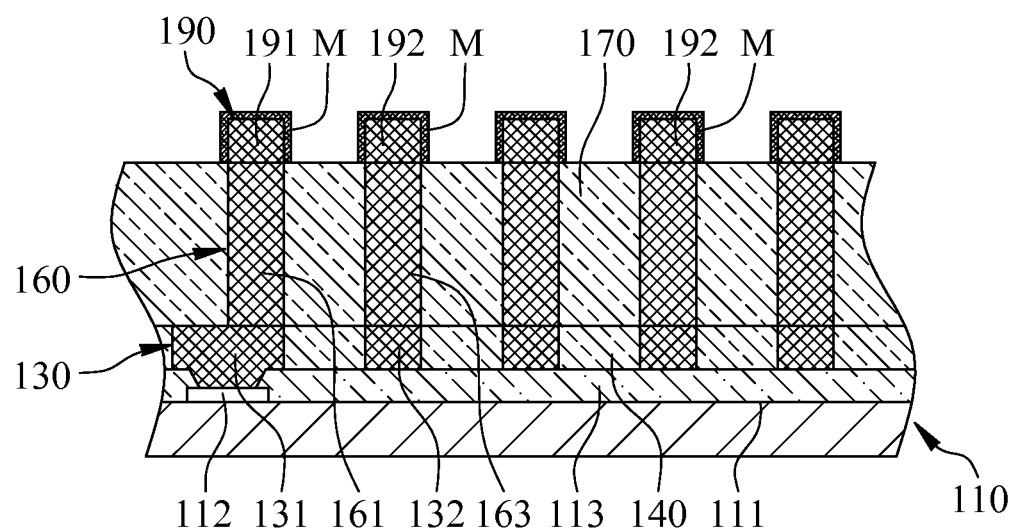
FIG. 3 is a cross-section diagram illustrating a method for fabricating a carrier with a three dimensional inductor in accordance with another preferred embodiment of the present invention.
Figure 4:
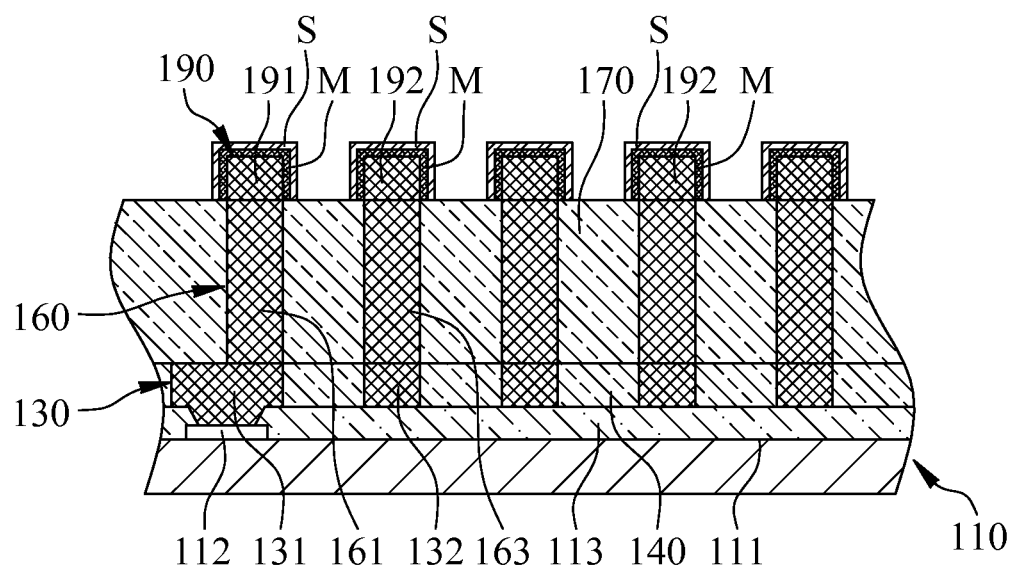
FIG. 4 is a cross-section diagram illustrating a method for fabricating a carrier with a three dimensional inductor in accordance with another preferred embodiment of the present invention.

With reference to FIGS. 1A to 1P and 2A to 2P, a method for fabricating a carrier with a three dimensional inductor in accordance with a preferred embodiment of the present invention comprises the steps of: first, with reference to FIGS. 1A and 2A, providing a substrate 110 having a surface 111, at least one first bond pad 112 and a protective layer 113, wherein the first bond pad 112 is disposed on the surface 111, the protective layer 113 is formed on the surface 111 and comprises at least one first opening 113a, a first disposing zone 113b and a plurality of second disposing zones 113c, the first bond pad 112 is exposed by the first opening 113a located at the first disposing zone 113b, the material of the substrate 110 can be chosen from one of Alumina, Aluminum Nitride, Gallium Arsenide or glass, and the protective layer 113 can be a passivation layer or repassivation layer; next, with reference to FIGS. 1B and 2B, forming a first photoresist layer 120 on the protective layer 113; then, with reference to FIGS. 1C and 2C, patterning the first photoresist layer 120 to form at least one second opening 121 and a plurality of first disposing slots 122, wherein the first disposing zone 113b is exposed by the second opening 121, and the second disposing zones 113c are exposed by the first disposing slots 122; thereafter, with reference to FIGS. 1D and 2D, forming a first metal layer 130 within the second opening 121 and the first disposing sots 122 to enable the first metal layer 130 to form a first connecting pad 131 and a plurality of first inductive portions 132, and each of the first inductive portions 132 comprises a first connecting terminal 132a, a second connecting terminal 132b and a first height H1; afterward, with reference to FIGS. 1E and 2E, removing the first photoresist layer 120; next, with reference to FIGS. 1F and 2F, forming a first dielectric layer 140 on the protective layer 113 and covering the first metal layer 130 with the first dielectric layer 140, wherein the first dielectric layer 140 comprises a third opening 141, a plurality of fourth openings 142 and a plurality of fifth openings 143, the first connecting pad 131 is exposed by the third opening 141, each of the first connecting terminals 132a is exposed by each of the fourth openings 142, and each of the second connecting terminals 132b is exposed by each of the fifth openings 143, in this embodiment, the first dielectric layer 140 further comprises a first dielectric surface 144, and the first metal layer 130 further comprises a first metal surface 133 coplanar with the first dielectric surface 144; then, with reference to FIGS. 1G and 2G, forming a second photoresist layer 150 on the first dielectric layer 140; thereafter, with reference to FIGS. 1H and 2H, patterning the second photoresist layer 150 to form a second disposing slot 151, a plurality of third disposing slots 152 and a plurality of fourth disposing slots 153, the first connecting pad 131 is exposed by the second disposing slot 151, each of the first connecting terminals 132a is exposed by each of the third disposing slots 152, and each of the second connecting terminals 132b is exposed by each of the fourth disposing slots 153; afterward, with reference to FIGS. 1I and 2I, forming a second metal layer 160 within the second disposing slot 151, the third disposing slots 152 and the fourth disposing slots 153 and enabling the second metal layer 160 to form a second inductive portion 161, a plurality of third inductive portions 162 and a plurality of fourth inductive portions 163, wherein the second inductive portion 161 is in connection with the first connecting pad 131 and comprises a first top surface 161 a and a second height H2, each of the third inductive portions 162 is in connection with each of the second connecting terminals 132b and comprises a second top surface 162a and a third height H3, each of the fourth inductive portions 163 is in connection with each of the first connecting terminals 132a and comprises a third top surface 163a and a fourth height H4, wherein the dimension of the first height H1 is smaller than that of the second height H2, the third height H3 and the fourth height H4; next, with reference to FIGS. 1J and 2J, removing the second photoresist layer 150; then, with reference to FIGS. 1K and 2K, forming a second dielectric layer 170 on the first dielectric layer 140 and covering the second metal layer 160 with the second dielectric layer 170, the second dielectric layer 170 comprises a first exposing slot 171, a plurality of second exposing slots 172 and a plurality of third exposing slots 173, the first top surface 161a is exposed by the first exposing slot 171, each of the second top surfaces 162a is exposed by each of the second exposing slots 172, and each of the third top surfaces 163a is exposed by each of the third exposing slots 173, in this embodiment, the second dielectric layer 170 further comprises a second dielectric surface 174, wherein the first top surface 161a, the second top surface 1626a, the third top surface 163a and the second dielectric surface 174 are coplanar; next, with reference to FIGS. 1L and 2L, forming a third photoresist layer 180 on the second dielectric layer 170; next, with reference to FIGS. 1M and 2M, patterning the third photoresist layer 180 to form a fifth disposing slot 181 and a plurality of sixth disposing slots 182, wherein the first top surface 161a and the second top surface 162a are exposed by the fifth disposing slot 181, and each of the second top surfaces 162a and each of the third top surfaces 163a are exposed by each of the sixth disposing slots 182; thereafter, with reference to FIGS. 1N and 2N, forming a third metal layer 190 in the fifth disposing slot 181 and the sixth disposing slots 182 and enabling the third metal layer 190 to form a fifth inductive portion 191 and a plurality of sixth inductive portions 192, the fifth inductive portion 191 is in connection with the second inductive portion 161 and the third inductive portion 162, each of the sixth inductive portions 192 is in connection with the third inductive portion 162 and the fourth inductive portion 163, the fifth inductive portion 191 comprises a fifth height H5, each of the sixth inductive portions 192 comprises a sixth height H6, wherein the dimension of the fifth height H5 and the sixth height H6 are respectively smaller than that of the second height H2, the third height H3 and the fourth height H4; next, with reference to FIGS. 1O and 2O, removing the third photoresist layer 180; eventually, with reference to FIGS. 1P and 2P, forming a third dielectric layer D on the second dielectric layer 170 and covering the third metal layer 190 with the third dielectric layer D, wherein the third dielectric layer D comprises a fourth exposing slot D1 and a plurality of fifth exposing slots D2, the fifth inductive portion 191 is exposed by the fourth exposing slot D1, and each of the sixth inductive portions 192 is exposed by each of the fifth exposing slots D2 therefore forming a carrier with a three dimensional inductor 100. In this embodiment, the third dielectric layer D further comprises a third dielectric surface D3, the third metal layer 190 further comprises a second metal surface 193 coplanar with the third dielectric surface D3. Or, with reference to FIG. 3, in another embodiment, a nickel/gold protective layer M is formed on the third metal layer 190 to replace the step of forming the third dielectric layer D on the second dielectric layer 170. Preferably, with reference to FIG. 4, in another embodiment, a solder protection layer S is formed on the nickel/gold protective layer M, and the material of the solder protection layer S can be chosen from one of solder or lead-free solder.

Figure 5:
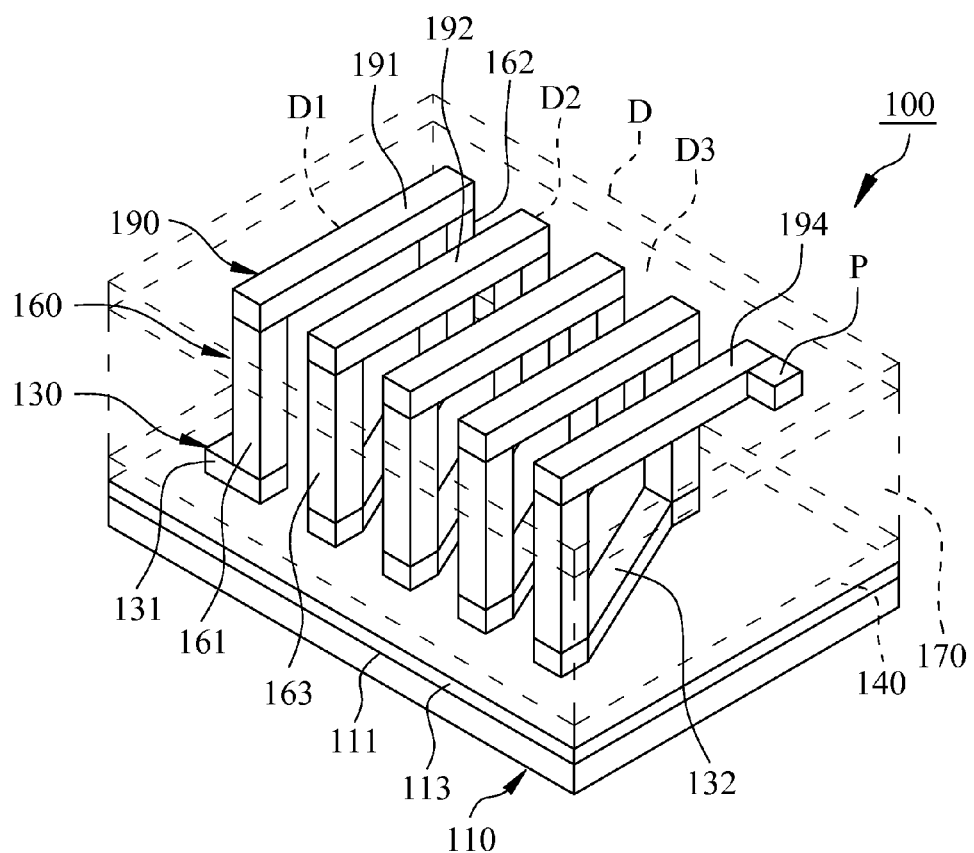
FIG. 5 is a three dimensional view illustrating a method for fabricating a carrier with a three dimensional inductor in accordance with another preferred embodiment of the present invention.

Besides, with reference to FIG. 1P, the carrier with the three dimensional inductor 100 further comprises a second connecting pad P formed on the protective layer 113. Referring to FIG. 1A, the substrate 110 further comprises a second bond pad 114 electrically connected with the second connecting pad P. With reference again to FIG. 1P, the second metal layer 160 comprises a seventh inductive portion 164 connected with the second connecting pad P, and the third metal layer 190 comprises an eighth inductive portion 194 connected with the seventh inductive portion 164 and the fourth inductive portion 163. Or, with reference to FIG. 5, in another embodiment, the second connecting pad P is formed on the second dielectric layer 170, and the eighth inductive portion 194 of the third metal layer 190 is in connection with the second connecting pad P and the fourth inductive portion 163. Owing to the inductor in this invention being a three dimensional inductor, reduction of a layout area in the same plane is performed. Therefore, the corresponding chip size can be decreased. Besides, because the inductor is a three dimensional design rather than a planar design, the magnetic flux direction of the inductor changes from normal (planar) to horizontal (three dimensional). It is beneficial for the electromagnetic coupling of the flip chip module in the flip chip process.

The carrier with the three dimensional inductor 100 comprises a substrate 110, a first metal layer 130, a first dielectric layer 140, a second metal layer 160, a second dielectric layer 170, a third metal layer 190 and a second connecting pad P. The substrate 110 comprises a surface 111, at least one first bond pad 112, a protective layer 113 and a second bond pad 114, wherein the first bond pad 112 is disposed on the surface 111, the protective layer 113 is formed on the surface 111 and comprises at least one first opening 113a, and the first bond pad 112 is revealed by the first opening 113a. The first metal layer 130 is formed on the protective layer 113 and comprises a first connecting pad 131 and a plurality of first inductive portions 132, and each of the first inductive portions 132 comprises a first connecting terminal 132a, a second connecting terminal 132b and a first height H1. The first dielectric layer 140 is formed on the protective layer 113, and the first metal layer 130 is covered by the first dielectric layer 140. The first dielectric layer 140 comprises a third opening 141, a plurality of fourth openings 142 and a plurality of fifth openings 143, wherein the first connecting pad 131 is exposed by the third opening 141, each of the first connecting terminals 132a is exposed by each of the fourth openings 142, and each of the second connecting terminals 132b is exposed by each of the fifth openings 143. The second metal layer 160 is formed on the first dielectric layer 140 and comprises a second inductive portion 161, a plurality of third inductive portions 162 and a plurality of fourth inductive portions 163, wherein the second inductive portion 161 is in connection with the first connecting pad 131 and comprises a first top surface 161a and a second height H2, each of the third inductive portions 162 is in connection with each of the first connecting terminal 132a and comprises a second top surface 162a and a third height H3, each of the fourth inductive portions 163 is in connection with each of the second connecting terminals 132b and comprises a third top surface 163a and a fourth height H3, wherein the dimension of the first height H1 is smaller than that of the second height H2, the third height H3 and the fourth height H4. The second dielectric layer 170 is formed on the first dielectric layer 140, and the second metal layer 160 is covered by the second dielectric layer 170. The second dielectric layer 170 comprises a first exposing slot 171, a plurality of second exposing slots 172 and a plurality of third exposing slots 173, wherein the first top surface 161a is exposed by the first exposing slot 171, each of the second top surfaces 162a is exposed by each of the second exposing slots 172, and each of the third top surfaces 163a is exposed by each of the third exposing slots 173. The third metal layer 190 is formed on the second dielectric layer 170 and comprises a fifth inductive portion 191 and a plurality of sixth inductive portions 192, wherein the fifth inductive portion 191 is in connection with the second inductive portion 161 and the third inductive portion 162, each of the sixth inductive portions 192 is in connection with the third inductive portion 162 and the fourth inductive portion 163. The fifth inductive portion 191 comprises a fifth height H5, each of the sixth inductive portions 192 comprises a sixth height H6, the dimension of the fifth height H5 and the sixth height H6 are respectively smaller than that of the second height H2, the third height H3 and the fourth height H4. Besides, with reference to FIG. 1P, the second connecting pad P is electrically connected with the second bond pad 114, the second metal layer 160 comprises a seventh inductive portion 164 connected with the second connecting pad P, and the third metal layer 190 comprises an eighth inductive portion 194 connected with the seventh inductive portion 164 and the fourth inductive portion 163. Or, referring to FIG. 5, in another embodiment, the second connecting pad P is formed on the second dielectric layer 170, and the eighth inductive portion 194 of the third metal layer 190 is in connection with the second connecting pad P and the fourth inductive portion 163.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A carrier with a three dimensional inductor comprises:
   a substrate having a surface, at least one first bond pad and a protective layer, wherein the first bond pad is disposed on the surface, the protective layer is formed on the surface and comprises at least one first opening, and the first bond pad is exposed by the first opening;
   a first metal layer formed on the protective layer, the first metal layer comprises a first connecting pad and a plurality of first inductive portions, wherein each of the first inductive portions comprises a first connecting terminal, a second connecting terminal and a first height;
   a first dielectric layer formed on the protective layer and covered the first metal layer, the first dielectric layer comprises a third opening, a plurality of fourth openings and a plurality of fifth openings, wherein the first connecting pad is exposed by the third openings, each of the first connecting terminals is exposed by the fourth openings, and each of the second connecting terminals is exposed by the fifth openings;
   a second metal layer formed on the first dielectric layer, the second metal layer comprises a second inductive portion, a plurality of third inductive portions and a plurality of fourth inductive portions, wherein the second inductive portion is in connection with the first connecting pad and comprises a first top surface and a second height, each of the third inductive portions is in connection with each of the first connecting terminals and comprises a second top surface and a third height, each of the fourth inductive portions is in connection with each of the second connecting terminals and comprises a third top surface and a fourth height, wherein the dimension of the first height is smaller than that of the second height, the third height and the fourth height;
   a second dielectric layer formed on the first dielectric layer and covered the second metal layer, the second dielectric layer comprises a first exposing slot, a plurality of second exposing slots and a plurality of third exposing slots, wherein the first top surface is exposed by the first exposing slot, each of the second top surfaces is exposed by each of the second exposing slots, and each of the third top surfaces is exposed by each of the third exposing slots; and a third metal layer formed on the second dielectric layer, the third metal layer comprises a fifth inductive portion and a plurality of sixth inductive portions, wherein the fifth inductive portion is in connection with the second inductive portion and the third inductive portion, each of the sixth inductive portions is in connection with the third inductive portion and the fourth inductive portion, the fifth inductive portion comprises a fifth height, each of the sixth inductive portions comprises a sixth height, wherein the dimension of the fifth height and the sixth height are respectively smaller than that of the second height, the third height and the fourth height.

2. The carrier with a three dimensional inductor in accordance with claim 1, further comprises a second connecting pad formed on the protective layer, the substrate further comprises a second bond pad electrically connected with the second connecting pad.

\* \* \* \* \*